United States Patent
Chen et al.

(10) Patent No.: US 11,968,833 B2
(45) Date of Patent: Apr. 23, 2024

(54) MEMORY DEVICE WITH VERTICALLY SEPARATED CHANNELS

(71) Applicant: MACRONIX INTERNATIONAL CO., LTD., Hsinchu (TW)

(72) Inventors: Wei-Chen Chen, Taoyuan (TW); Hang-Ting Lue, Hsinchu (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 479 days.

(21) Appl. No.: 17/149,782

(22) Filed: Jan. 15, 2021

(65) Prior Publication Data

US 2022/0231041 A1 Jul. 21, 2022

(51) Int. Cl.
*H10B 43/27* (2023.01)
*H01L 29/10* (2006.01)
*H10B 43/10* (2023.01)
*H10B 43/35* (2023.01)

(52) U.S. Cl.
CPC .......... *H10B 43/27* (2023.02); *H01L 29/1037* (2013.01); *H10B 43/10* (2023.02); *H10B 43/35* (2023.02)

(58) Field of Classification Search
CPC ........ H10B 69/00; H10B 53/00; H10B 53/10; H10B 53/20; H10B 53/30; H10B 53/40; H10B 53/50; H10B 41/00; H10B 41/10; H10B 41/20; H10B 41/23; H10B 41/27; H10B 41/30; H10B 41/35; H10B 41/40–44; H10B 41/46–50; H10B 41/60; H10B 41/70; H10B 43/00; H10B 43/10; H10B 43/20; H10B 43/23; H10B 43/27; H10B 43/30; H10B 43/35; H10B 43/40; H10B 43/50; H10B 51/00; H10B 51/10; H10B 51/20; H10B 51/30; H10B 51/40; H10B 51/50
See application file for complete search history.

(56) References Cited

U.S. PATENT DOCUMENTS

| | | | |
|---|---|---|---|
| 6,870,215 B2 | 3/2005 | Endoh et al. | |
| 2008/0093653 A1* | 4/2008 | Park | H10B 41/30 257/E27.103 |
| 2014/0175530 A1* | 6/2014 | Chien | H01L 29/66833 438/264 |

(Continued)

FOREIGN PATENT DOCUMENTS

| | | |
|---|---|---|
| JP | 2003068885 A | 3/2003 |
| JP | 2018-037441 A | 3/2018 |
| KR | 20200112976 A | 10/2020 |

OTHER PUBLICATIONS

Japanese language office action dated Jun. 7, 2022, issued in application No. JP 2021-039311.

(Continued)

Primary Examiner — Didarul A Mazumder
Assistant Examiner — Gustavo G Ramallo
(74) Attorney, Agent, or Firm — McClure, Qualey & Rodack, LLP

(57) ABSTRACT

A memory device includes a source element, a drain element, channel layers, control electrode layers, and a memory layer. The channel layers are individually electrically connected between the source element and the drain element. Memory cells are defined in the memory layer between the control electrode layers and the channel layers.

21 Claims, 18 Drawing Sheets

(56) References Cited

U.S. PATENT DOCUMENTS

| | | |
|---|---|---|
| 2017/0005106 A1 | 1/2017 | Zhang |
| 2017/0287929 A1* | 10/2017 | Kim .................. H01L 28/00 |
| 2017/0358362 A1* | 12/2017 | Lee .................. H10B 41/35 |
| 2019/0006009 A1* | 1/2019 | Harari .............. G11C 16/0416 |
| 2020/0013791 A1 | 1/2020 | Or-Bach et al. |
| 2020/0373325 A1 | 11/2020 | Kim et al. |
| 2020/0388627 A1 | 12/2020 | Hopkins et al. |

OTHER PUBLICATIONS

English language translation of office action dated Jun. 7, 2022, issued in application No. JP 2021-039311 (pp. 1-3 of attachment).

KIPO Office Action dated Dec. 20, 2022 in Korean application No. 10-2021-0022181.

JPO Office Action dated Jan. 4, 2023 in Japanese application No. 2021-039311.

\* cited by examiner

MEMORY DEVICE WITH VERTICALLY SEPARATED CHANNELS

BACKGROUND

Technical Field

The disclosure relates to a memory device.

Description of the Related Art

With development of the semiconductor technology, semiconductor devices have become smaller in size. In the semiconductor technology, shrinking of feature sizes, and improving operation speed, efficiency, density, and cost per Integrated circuit are important objectives. For satisfy customer need and the market demand, it is important to shrink devices in size and also to maintain the electricity of devices.

SUMMARY

The present disclosure relates to a memory device. The memory device can have an excellent operation efficiency.

According to an embodiment, a memory device is provided. The memory device comprises a source element, a drain element, channel layers, control electrode layers, and a memory layer. The channel layers are individually electrically connected between the source element and the drain element. Memory cells are defined in the memory layer between the control electrode layers and the channel layers.

According to another embodiment, a memory device is provided. The memory device comprises a channel element, control electrode layers, and a memory layer. The channel element comprises thicker channel portions and thinner channel portions electrically connected to each other. Memory cells are defined in the memory layer between the thicker channel portions and the control electrode layers.

According to yet another embodiment, a memory device is provided. The memory device comprises control electrode layers, channel layers, and a memory layer. The channel layers and the control electrode layers are arranged alternately and overlap with each other in a first direction. Memory cells are defined in the memory layer between the control electrode layers and the channel layers.

The above and other embodiments of the disclosure will become better understood with regard to the following detailed description of the non-limiting embodiment(s). The following description is made with reference to the accompanying drawings.

DETAILED DESCRIPTION

According to a concept of the present disclosure, in a memory device, a channel layer may overlap with a control electrode layer in different directions, and therefore an active channel portion corresponding to a memory cell can have a lamer effective channel width so as to improve operation efficiency for the memory device. According to another concept of the present disclosure, channel layers may be individually electrically connected between a source element and a drain element, by which interferences between adjacent memory cells during operating can be avoided. According to yet another concept of the present disclosure, in a memory device, a channel element comprises a thicker channel portion and a thinner channel portion, wherein the thicker channel portion is an active channel portion corresponding to a memory cell, and therefore the device can have a higher cell current. The present disclosure is illustrated with 3D AND memory device in embodiments, but is not limited thereto.

The illustrations may not be necessarily drawn to scale, and there may be other embodiments of the present disclosure which are not specifically illustrated. Thus, the specification and the drawings are to be regard as an illustrative sense rather than a restrictive sense. Moreover, the descriptions disclosed in the embodiments of the disclosure such as detailed construction, manufacturing steps and material selections are for illustration only, not for limiting the scope of protection of the disclosure. The steps and elements in details of the embodiments could be modified or changed according to the actual needs of the practical applications. The disclosure is not limited to the descriptions of the embodiments. The illustration uses the same/similar symbols to indicate the same/similar elements.

A memory device in an embodiment is illustrated with referring to FIG. 1A to FIG. 1D.

Figure 1A:
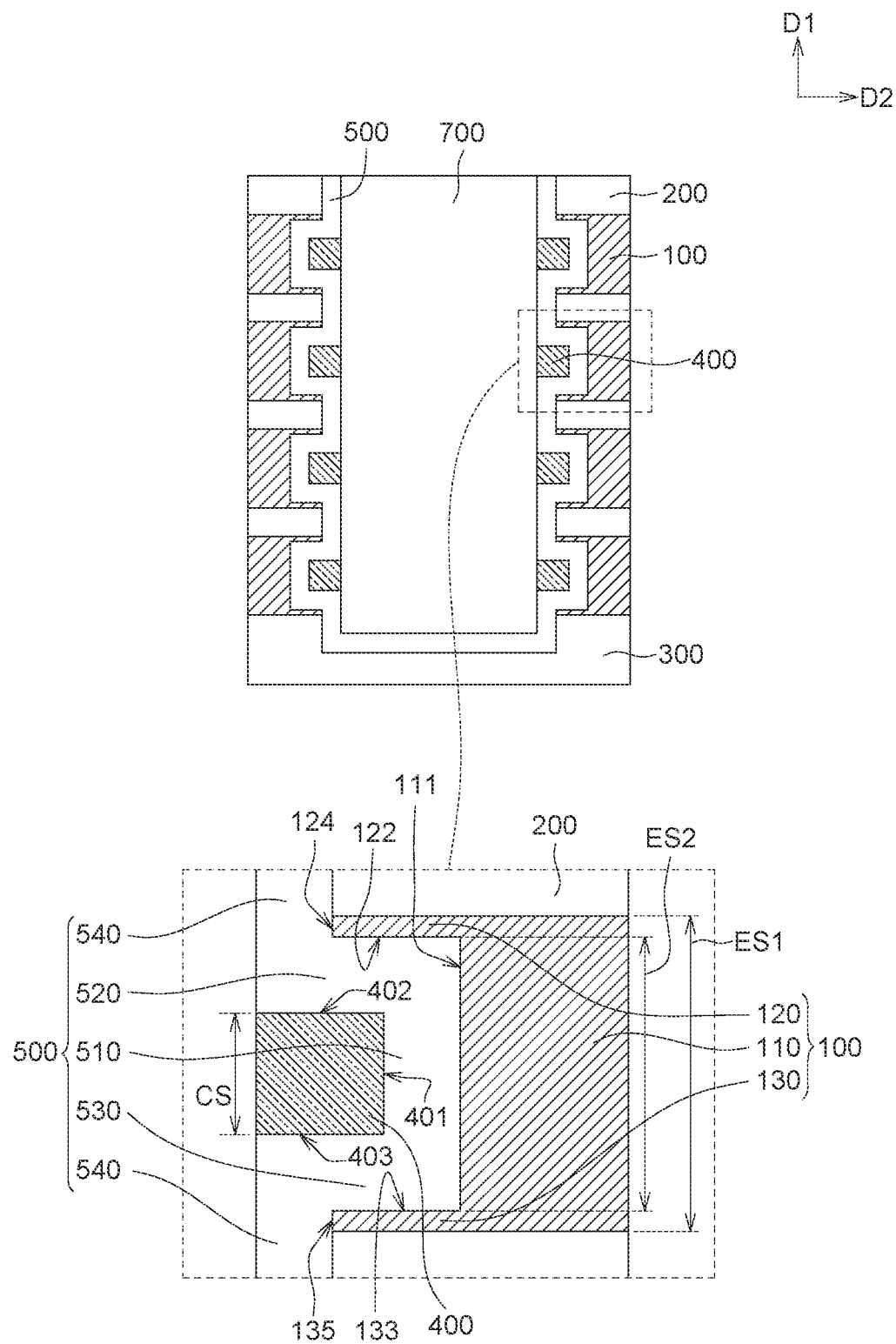
FIG. 1A is a cross-section view of a memory device in an embodiment.

FIG. 1A to FIG. 10 are referred to. FIG. 1A and FIG. 10 are cross-section views respectively drawn along a A-A line and a C-C line in a stereoscopic view in FIG. 1B.

Control electrode layers 100 and insulating layers 200 are arranged alternately on a substrate 300 in a first direction D1 (for example, a vertical direction, or a Z-direction, or a normal direction to an upper surface of the substrate 300). The control electrode layers 100 are separated from each other by the insulating layers 200. Channel layers 400 and the insulating layers 200 are arranged alternately in the first direction D1.

The control electrode layer 100 comprises a trunk electrode 110, a first branch electrode 120 and a second branch electrode 130. The trunk electrode 110 may be electrically connected between the first branch electrode 120 and the second branch electrode 130. The control electrode layer 100 comprises a first electrode surface 111 of the trunk electrode 110, a second electrode surface 122 of the first branch electrode 120 and a third electrode surface 133 of the second branch electrode 130. The first electrode surface 111 is between the second electrode surface 122 and the third electrode surface 133. The first electrode surface 111 is a longitudinal electrode surface, or a sidewall electrode surface. The second electrode surface 122 and the third electrode surface 133 are lateral electrode surfaces facing toward each other. The second electrode surface 122 is an electrode surface facing toward the substrate 300. The third electrode surface 133 is an electrode surface backward the substrate 300. The control electrode layer 100 further comprises a fourth electrode surface 124 of the first branch electrode 120 and a fifth electrode surface 135 of the second branch electrode 130. The second electrode surface 122 of the first branch electrode 120 is between the first electrode surface 111 of the trunk electrode 110 and the fourth electrode surface 124 of the first branch electrode 120. The third electrode surface 133 of the second branch electrode 130 is between the first electrode surface 111 of the trunk electrode 110 and the fifth electrode surface 135 of the second branch electrode 130. In embodiments, the control electrode layers 100 may be functioned as word lines (WL).

The branch electrodes of the control electrode layers 100 (comprising the first branch electrodes 120 and the second branch electrodes 130) and the channel layers 400 are arranged alternately in the first direction D1. The channel layer 400 overlaps between the first branch electrode 120 and the second branch electrode 130 of the control electrode layer 100. The trunk electrodes 110 of the control electrode layers 100 may overlap with the channel layers 400 in a second direction D2. The channel layer 400 is among the first electrode surface 111 of the trunk electrode 110, the second electrode surface 122 of the first branch electrode 120 and the third electrode surface 133 of the second branch electrode 130. The second direction D2 may be a lateral direction substantially perpendicular to the first direction D1, such as a horizontal direction, a X-direction, a Y-direction, or any lateral direction in a X-Y plane.

The channel layer 400 comprises a first channel surface 401, a second channel surface 402 and a third channel surface 403. The first channel surface 401 is between the second channel surface 402 and the third channel surface 403. The first channel surface 401 may be a longitudinal channel surface or a sidewall channel surface. The second channel surface 402 and the third channel surface 403 may be lateral channel surfaces backward each other. The second channel surface 402 may be a channel surface backward the substrate 300. The third channel surface 403 may be a channel surface facing toward the substrate 300.

The first channel surface 401 and the first electrode surface 111 face toward each other, and overlap in the second direction D2. The second channel surface 402 and the second electrode surface 122 face toward each other, and overlap in the first direction D1. The third channel surface 403 and the third electrode surface 133 face toward each other, and overlap in the first direction D1.

In this embodiment, a size CS of the channel layer 400 in the first direction D1 is smaller than a size ES1 of the trunk electrode 110 of the control electrode layer 100 in the first direction D1, and is smaller than a size ES2 of the first electrode surface 111 of the trunk electrode 110 in the first direction D1.

A memory layer 500 may comprise a first memory layer portion 510, a second memory layer portion 520 and a third memory layer portion 530. The first memory layer portion 510 is between the second memory layer portion 520 and the third memory layer portion 530. The first memory layer portion 510 may be between the first channel surface 401 of the channel layer 400 and the first electrode surface 111 of the control electrode layer 100. The second memory layer portion 520 may be between the second channel surface 402 of the channel layer 400 and the second electrode surface 122 of the control electrode layer 100. The third memory layer portion 530 may be between the third channel surface 403 of the channel layer 400 and the third electrode surface 133 of the control electrode layer 100. The memory layer 500 may further comprise a fourth memory layer portion 540. The fourth memory layer portion 540 is connected between the second memory layer portion 520 and the third memory layer portion 530. The fourth memory layer portion 540 is on the fourth electrode surface 124 of the first branch electrode 120, and is on the fifth electrode surface 135 of the second branch electrode 130. The channel layers 400 are separated from each other in the first direction by the second memory layer portion 520, the third memory layer portion 530 and the fourth memory layer portion 540 of the memory layer 500.

The channel layer 400 and the memory layer 500 have a first interface therebetween. In this embodiment, the first interface comprises the first channel surface 401, the second channel surface 402 and the third channel surface 403. The first interface may comprise a bend surface containing the first channel surface 401, the second channel surface 402 and the third channel surface 403 having an included angle (such as 90 degrees, an acute angle or an obtuse angle) therebetween. The control electrode layer 100 and the memory layer 500 have a second interface therebetween. In this embodiment, the second interface comprises the first electrode surface 111, the second electrode surface 122, the third electrode surface 133, the fourth electrode surface 124 and the fifth electrode surface 135. The second interface may comprise a bend surface containing the first electrode surface 111, the second electrode surface 122, the third electrode surface 133, the fourth electrode surface 124 and the fifth electrode surface 135 having an included angle (such as 90 degrees, an acute angle or an obtuse angle) therebetween. In this embodiment, the first interface and the second interface comprise bend surfaces having similar or identical bending profile. Memory cells may be defined in the first memory layer portion 510, the second memory layer portion 520 and the third memory layer portion 530 of the memory layer 500 between the first interface and the second interface.

Figure 1B:
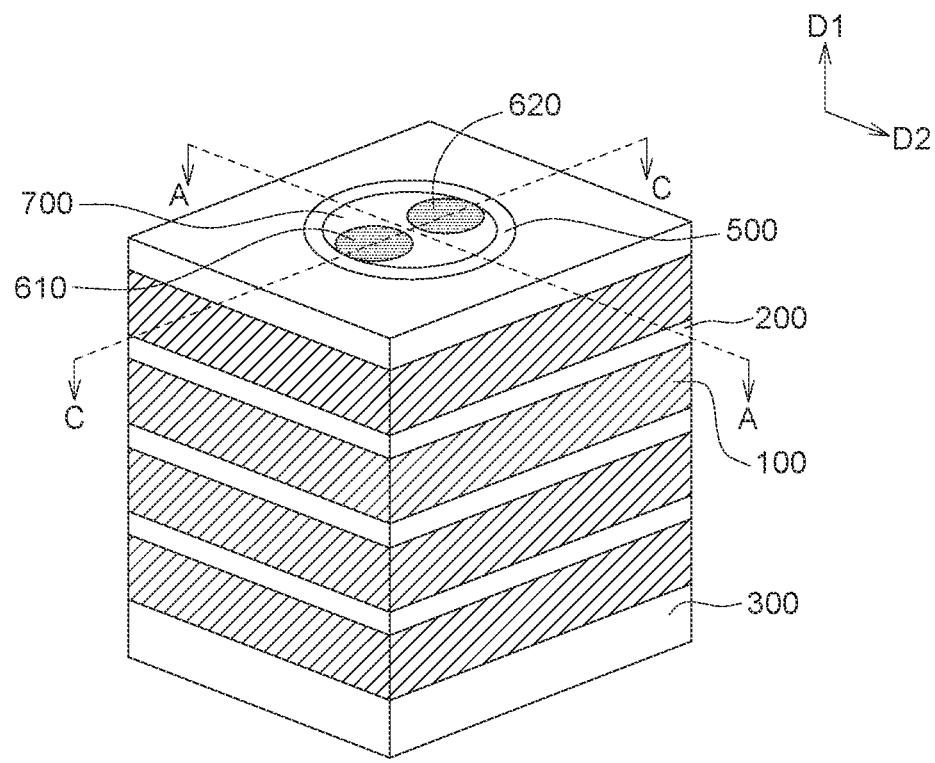
FIG. 1B is a stereoscopic view of a memory device in an embodiment.
Figure 1C:
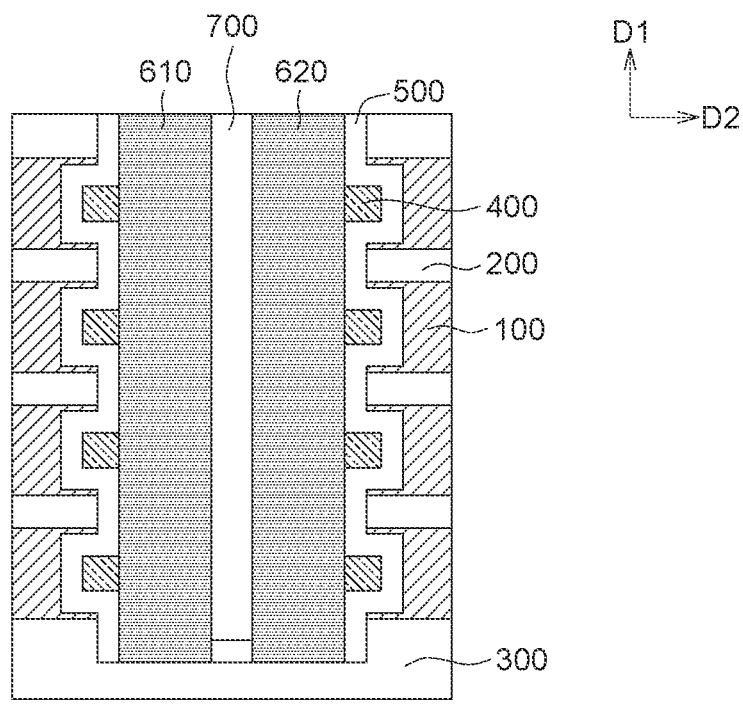
FIG. 1C is a cross-section view of a memory device in an embodiment.
Figure 1D:
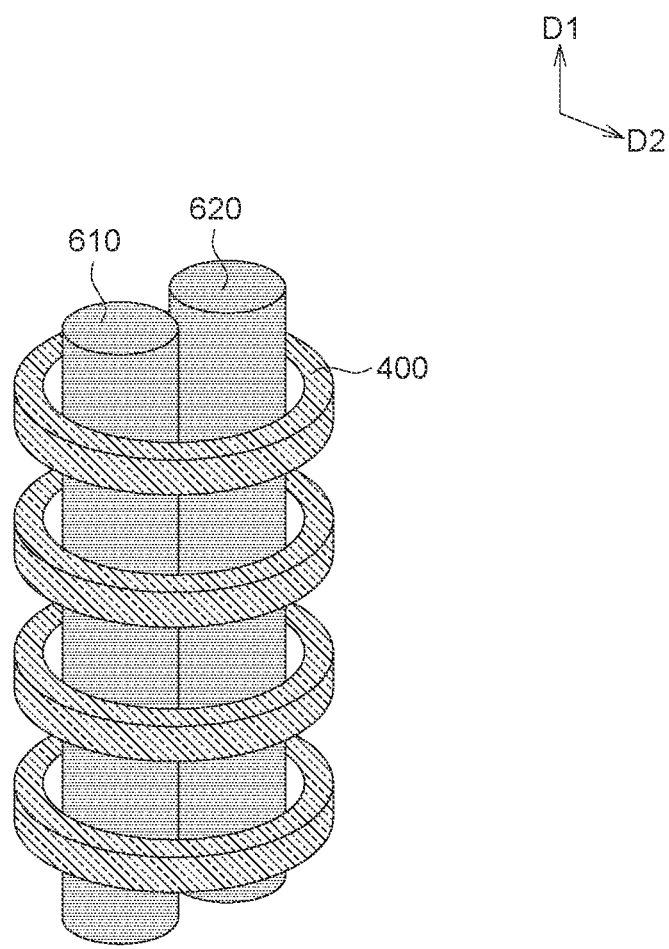
FIG. 1D illustrates a source element, a drain element, and a channel layer of a memory device in an embodiment.
Figure 14:
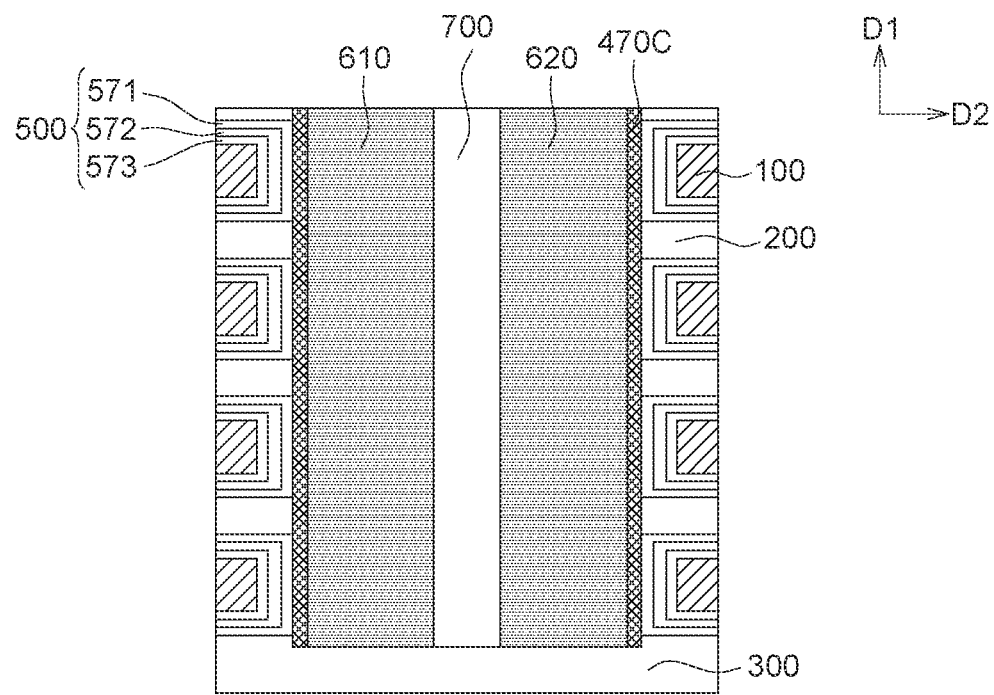
FIG. 14 illustrates a memory device of a comparative example.

FIG. 1B to FIG. 1D are referred to. FIG. 1D illustrates a source element 610, a drain element 620 and the channel layer 400 merely. The Reference of Assignee: P1090247US Reference of SUNDIAL: US15274PA source element 610 and the drain element 620 may be separated from each other by an insulating element 700 (FIG. 1A to FIG. 1C). The source element 610 and the drain element 620 may be electrode pillars extending along the first direction D1. The channel layer 400 may be disposed outside the source element 610, the drain element 620 and the insulating element 700. The channel layer 400 is electrically connected between the source element 610 and the drain element 620. Specifically, in this embodiment, the channel layer 400 separated from each other are individually electrically connected between the source element 610 and the drain element 620, FIG. 14 illustrates a memory device of a comparative example, which has a channel film 4700 extending along the first direction D1, and overlapping with the control electrode layer 100 only in the second direction D2. Compared with the memory device of the comparative example, the memory device illustrated with referring to FIG. 1A to FIG. 10 has at least the following advantages. In embodiments, the channel layer 400 overlaps with the control electrode layer 100 in the first direction D1 and the second direction D2 substantially perpendicular to the first direction D1, and therefore the channel layer 400 corresponding to a memory cell can have a bigger effective channel width, by which the memory device can have better operation efficiency, such as a faster programming rate. In embodiments, the memory device can have a larger ISPP slope and a larger program window. In embodiments, the channel layers 400 are individually connected between the source element 610 and the drain element 620, and therefore interferences between adjacent memory cells during operating can be avoided. On the contrary, in the memory device of the comparative example in FIG. 14, portions of the channel film 470C between the control electrode layers 100 may form leakage current paths resulting in interferences during operating memory cells.

A memory device in another embodiment is illustrated with referring to FIG. 2A to FIG. 2D.

Figure 2A:
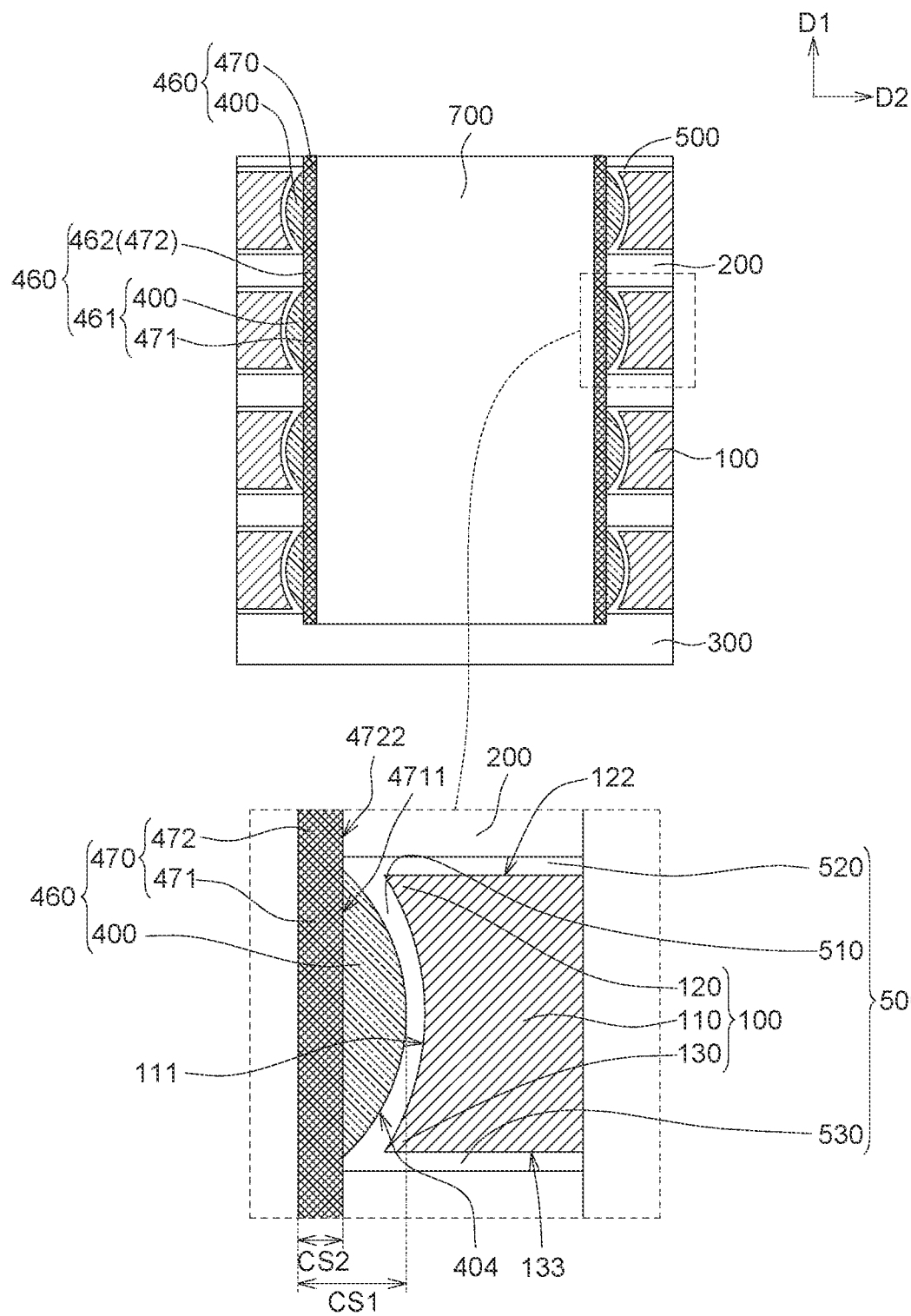
FIG. 2A is a cross-section view of a memory device in another embodiment.
Figure 2B:
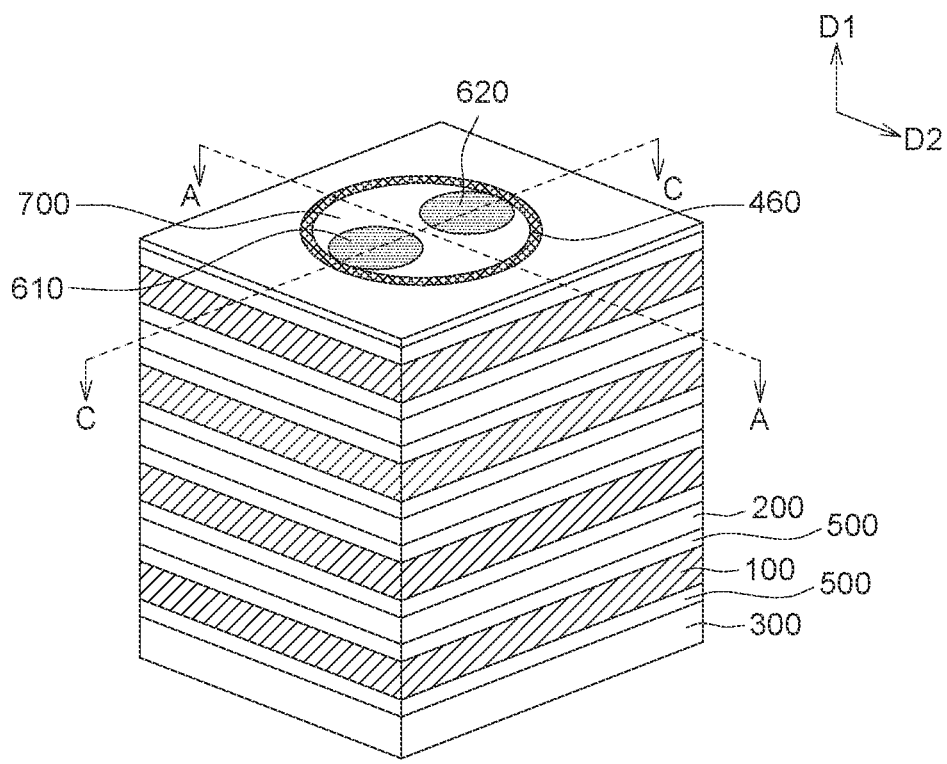
FIG. 2B is a stereoscopic view of a memory device in another embodiment.
Figure 2C:
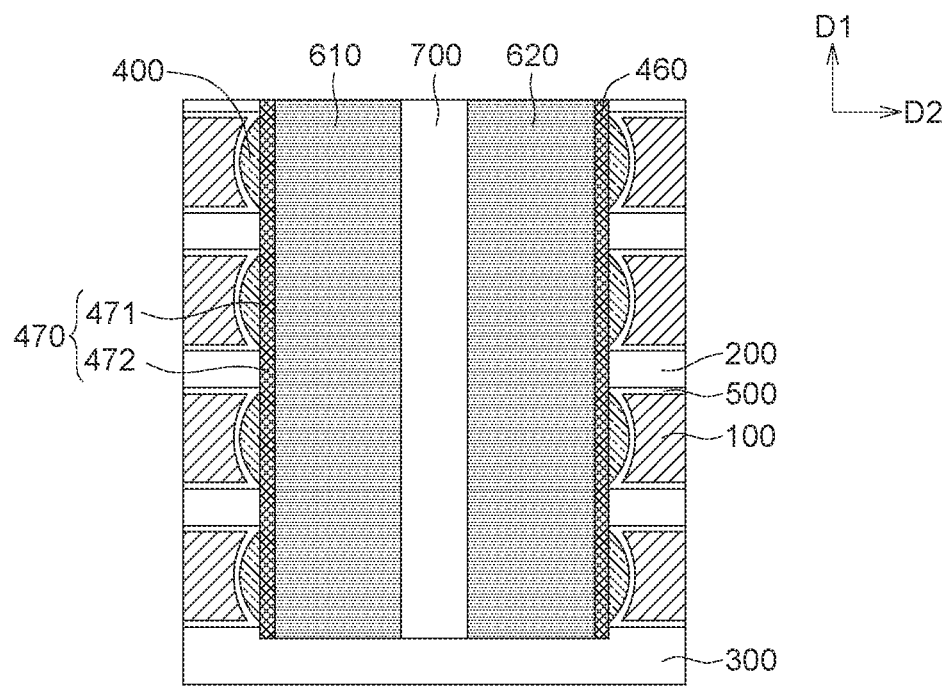
FIG. 2C is a cross-section view of a memory device in another embodiment.

FIG. 2A to FIG. 2C are referred to. FIG. 2A and FIG. 2C are cross-section views respectively drawn along a A-A line and a C-C line in a stereoscopic view in FIG. 2B. The control electrode layer 100 comprises the first electrode surface 111, the second electrode surface 122 and the third electrode surface 133. The first electrode surface 111 is between the second electrode surface 122 and the third electrode surface 133 opposing to the second electrode surface 122. The first electrode surface 111 may be a longitudinal electrode surface or a sidewall electrode surface. The first electrode surface 111 may be a curve surface. The second electrode surface 122 and the third electrode surface 133 are lateral electrode surfaces backward each other. The second electrode surface 122 is an electrode surface backward the substrate 300. The third electrode surface 133 is an electrode surface facing toward the substrate 300.

The control electrode layer 100 comprises the trunk electrode 110, the first branch electrode 120 and the second branch electrode 130. The trunk electrode 110 may be electrically connected between the first branch electrode 120 and the second branch electrode 130. The first electrode surface 111 of the control electrode layer 100 comprises electrode surfaces of the trunk electrode 110, the first branch electrode 120 and the second branch electrode 130.

A channel element 460 comprises a channel film 470 and the channel layer 400.

The channel film 470 may comprise a first channel film portion 471 and a second channel film portion 472. The first channel film portion 471 has a first channel surface 4711. The second channel film portion 472 has a second channel surface 4722. The channel layer 400 may be on the first channel surface 4711 of the first channel film portion 471. The insulating layer 200 may be on the second channel surface 4722 of the second channel film portion 472. The channel layers 400 may be separated from each other in the first direction D1, and may be electrically connected to each other through the first channel film portions 471 adjoined with the channel layers 400 and the second channel film portion 472 connected between the first channel film portions 471.

The channel layer 400 may be formed by a deposition method. In an embodiment, the channel layer 400 may be formed by growing from the first channel surface 4711 of the first channel film portion 471 with an epitaxial method. In an embodiment, the channel layer 400 may have a lens-like structure. The channel layer 400 have a various size of the first direction D1 gradually becoming smaller along the second direction D2 towards the control electrode layer 100. For example, a portion of the channel layer 400 adjacent to the first channel film portion 471 may have a maximum size of the first direction D1. A portion of the channel layer 400 away from the first channel film portion 471 may have a minimum size of the first direction D1. A channel surface 404 (sidewall channel surface) of the channel layer 400 may be a curve surface protruding towards the control electrode layer 100. In embodiments, the channel layer 400 is not limited to a profile as shown in the figures. The channel layer 400 may have any possible profile resulted from being formed on the first channel film portion 471 by a deposition method, or being formed by growing from the first channel surface 4711 of the first channel film portion 471 by an epitaxial method.

The branch electrodes of the control electrode layers 100 (comprising the first branch electrodes 120 and the second branch electrodes 130) and the channel layers 400 may be arranged alternately in the first direction D1. The channel layer 400 may overlap between the first branch electrode 120 and the second branch electrode 130 of the control electrode layer 100 in the first direction D1. The trunk electrode 110 of the control electrode layer 100 may overlap with the channel layer 400 in the second direction D2. However, the present disclosure is not limited thereto.

The channel element 460 comprises thicker channel portions 461 and thinner channel portions 462. The thicker channel portion 461 comprises the channel layer 400 and the first channel film portion 471 of the channel film 470. The thinner channel portion 462 comprises the second channel film portion 472 of the channel film 470, or consists of the second channel film portion 472. A size OSI of the thicker channel portion 461 in the second direction D2 is larger than a size CS2 of the thinner channel portion 462 in the second direction D2.

The memory layer 500 may comprise the first memory layer portion 510, the second memory layer portion 520 and the third memory layer portion 530. The first memory layer portion 510 is between the second memory layer portion 520 and the third memory layer portion 530. The first memory layer portion 510 may be between the channel surface 404 of the channel layer 400 and the first electrode surface 111 of the control electrode layer 100. The second memory layer portion 520 may be between the second electrode surface 122 of the control electrode layer 100 and a lower insulating surface of the insulating layer 200. The third memory layer portion 530 may be between the third electrode surface 133 of the control electrode layer 100 and an upper insulating surface of the insulating layer 200. The control electrode layer 100 is on a sidewall channel surface of the thicker channel portion 461 (or the channel surface 404 of the channel layer 400). The insulating layer 200 is on a sidewall channel surface of the thinner channel portion 462 (or the second channel film portion 472).

The channel surface 404 of the channel layer 400 may be adjoined with the memory layer 500, Therefore, the first interface between the channel layer 400 and the memory layer 500 may be a curve surface. The first electrode surface 111 of the control electrode layer 100 may be a curve surface having a profile complementary to the channel surface 404. The first electrode surface 111 of the control electrode layer 100 may be adjoined with the first memory layer portion 510 of the memory layer 500. Therefore, the second interface between the control electrode layer 100 and the first memory layer portion 510 may be a curve surface. The first interface and the second interface may have similar or identical curving direction. The memory cells may be defined in the first memory layer portion 510 of the memory layer 500.

Figure 2D:
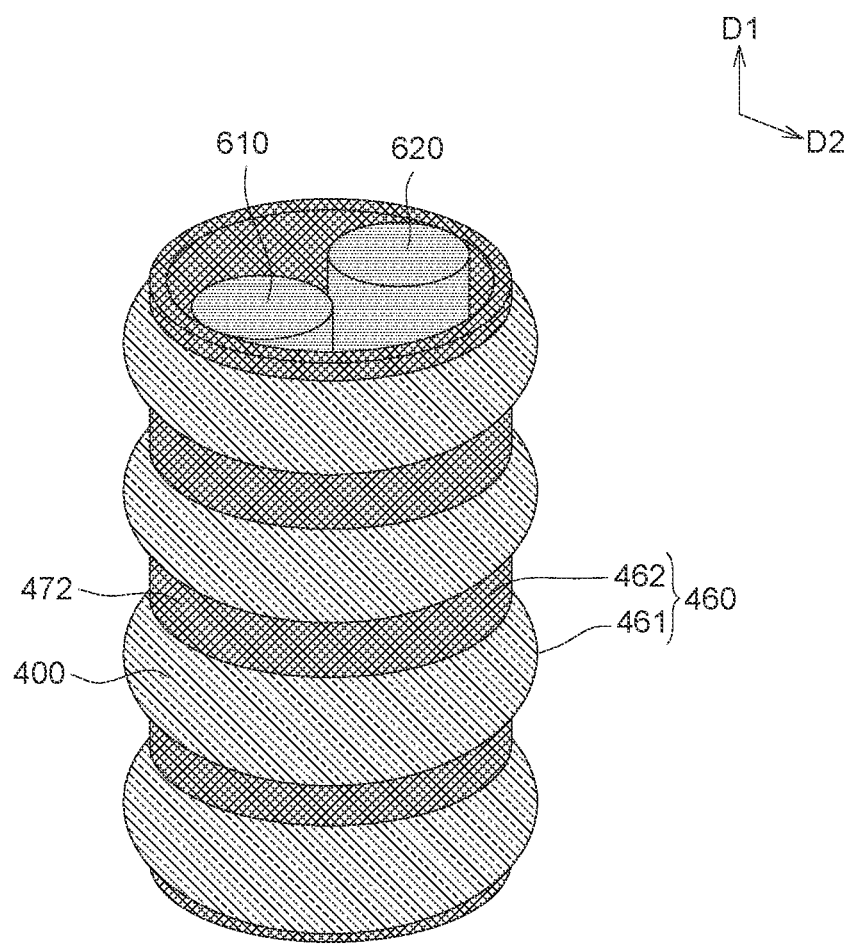
FIG. 2D illustrates a source element, a drain element, and a channel element of a memory device in another embodiment.

FIG. 2A to FIG. 2D are referred to. FIG. 2D illustrates the source element 610, the drain element 620 and the channel element 460 merely. The channel element 460 is outside the source element 610 and the drain element 620, and is electrically connected between the source element 610 and the drain element 620.

FIG. 14 illustrates the memory device of the comparative example, which has only the channel film 470C extending along the first direction D1, and the channel film 4700 has an uniform size in the second direction D2 (i.e. an uniform thickness). Compared with the memory device of the comparative example, the memory device illustrated with referring to FIG. 2A to FIG. 2D has at least the following advantages. In embodiments, the thicker channel portion 461 overlaps with the control electrode layer 100 in the first direction D1 and the second direction D2 substantially perpendicular to the first direction D1, and therefore the thicker channel portion 461 corresponding to a memory cell can have a bigger effective channel width, by which the memory device can have better operation efficiency, such as a faster programming rate. In embodiments, an active channel portion corresponding to a memory cell is the thicker channel portion 461 having a thickness (or a size in the second direction D2) larger than that of the thinner channel portion 462 (or the channel film 470/4700) between the control electrode layers 100, and therefore the memory device can have a higher cell current.

FIG. 3A to FIG. 9C illustrate a manufacturing method for a memory device in an embodiment.

Figure 3A:
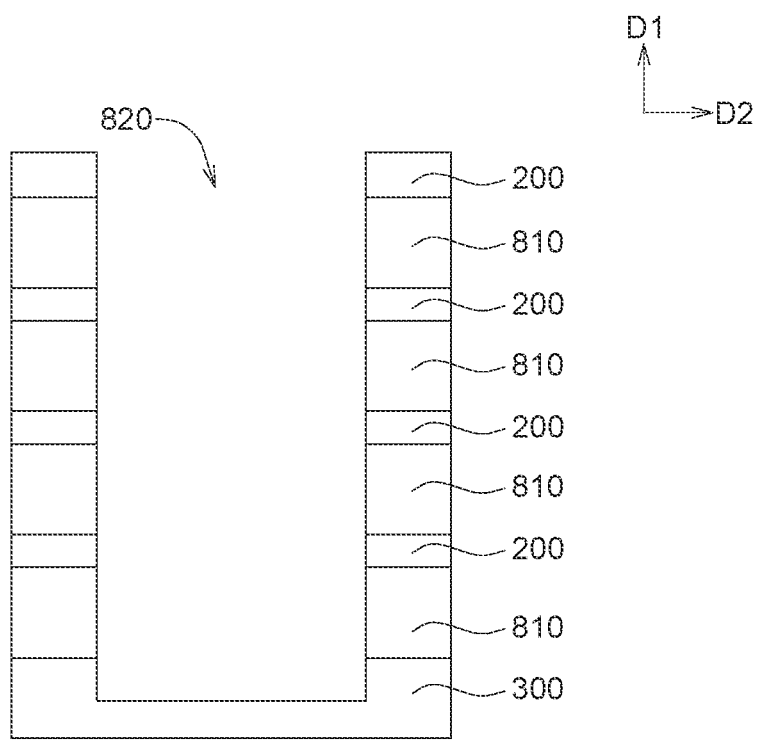
FIG. 3A to FIG. 9C illustrate a manufacturing method for a memory device in an embodiment.
Figure 3B:
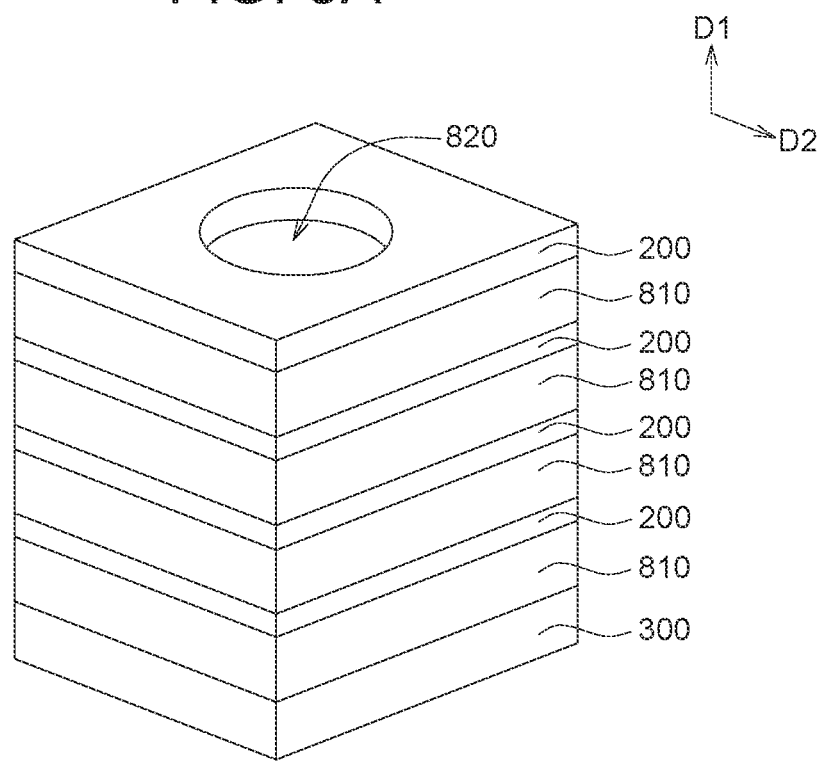

FIG. 3A and FIG. 3B are referred to. The insulating layers 200 and first material layers 810 may be stacked alternately on the substrate 300 by a deposition method to form a stacked structure. The substrate 300 may comprise silicon or other semiconductor materials, for example. The insulating layer 200 may have a material different from the first material layer 810. In an embodiment, the insulating layer 200 may comprise an oxide such as silicon oxide. The first material layer 810 may comprise a nitride such as silicon nitride. However, the present disclosure is not limited thereto. An opening 820 is formed in the stacked structure.

Figure 4:
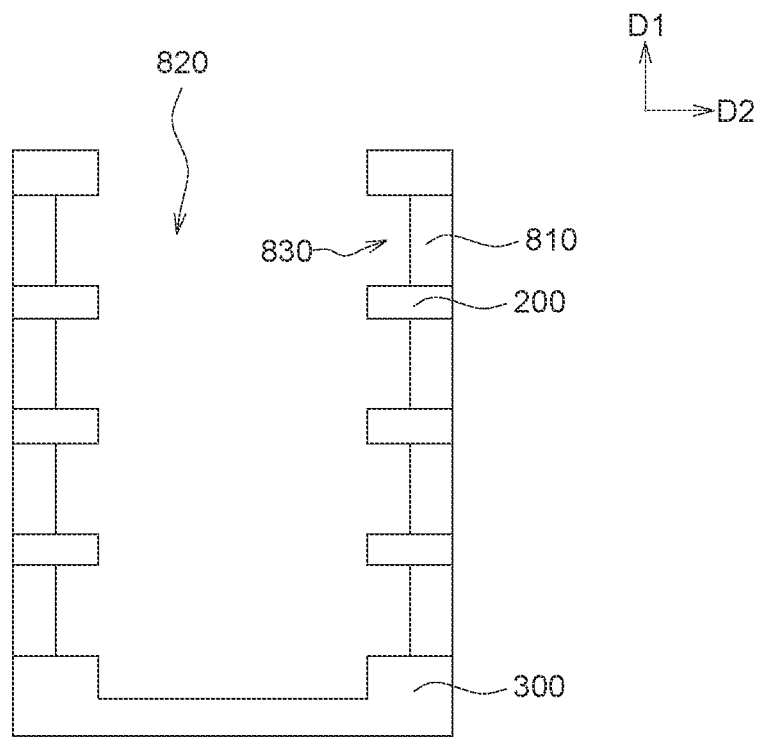

FIG. 4 is referred to. Portions of the first material layers 810 exposed by the opening 820 are removed by an etching back method to form recesses 830 between the insulating layers 200.

Figure 5:
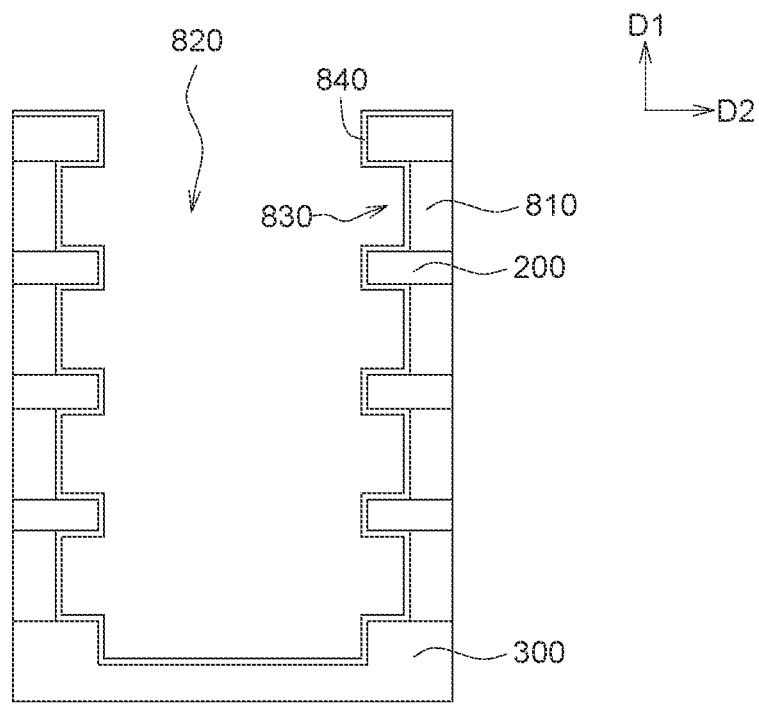

FIG. 5 is referred to. A second material layer 840 may be formed on the substrate 300 and the stacked structure by a deposition method. The second material layer 840 may be formed on sidewall surfaces of the first material layers 810 and the lower insulating surfaces and the upper insulating surfaces of the insulating layers 200 exposed by the recesses 830. The second material layer 840 may be formed on sidewall insulating surfaces of the insulating layers 200 and an upper surface of the substrate 300 exposed by the opening 820. In addition, the second material layer 840 may be formed on an upper surface of top one of the insulating layers 200. The second material layer 840 may have a material identical with the material of the first material layer 810. In an embodiment, the second material layer 840 may comprise a nitride such as silicon nitride. However, the present disclosure is not limited thereto.

Figure 6:
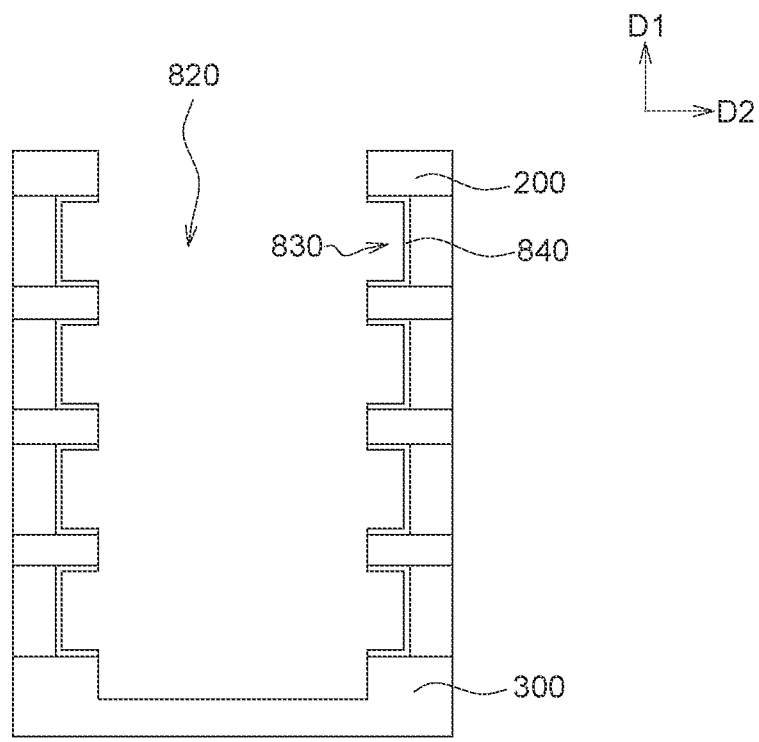

FIG. 6 is referred to. A portion of the second material layer 840 in the opening 820, and one the upper surface of the top one of the insulating layers 200 may be removed by an etching method, another portion of the second material layer 840 in the recesses 830 are remained.

Figure 7A:
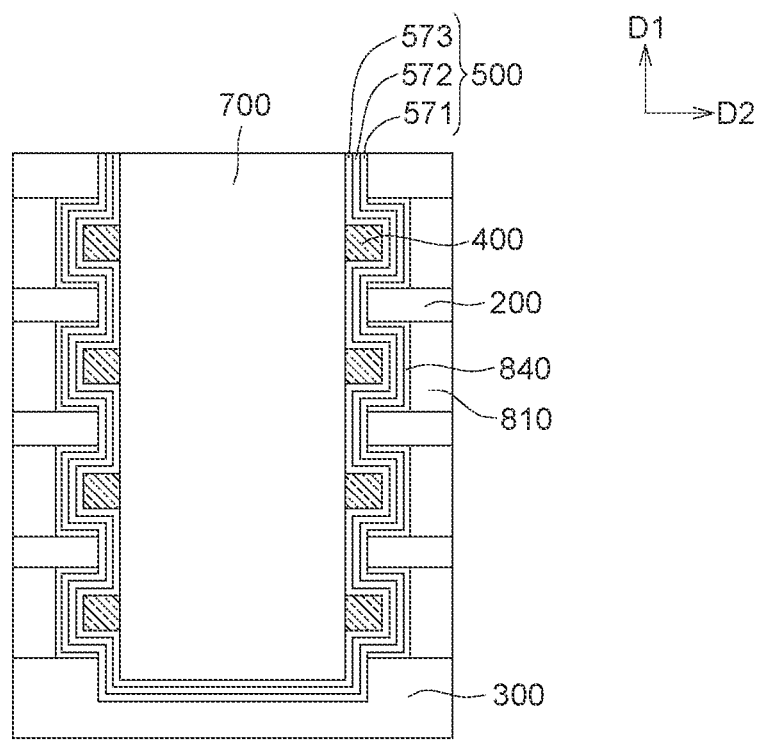
Figure 7B:
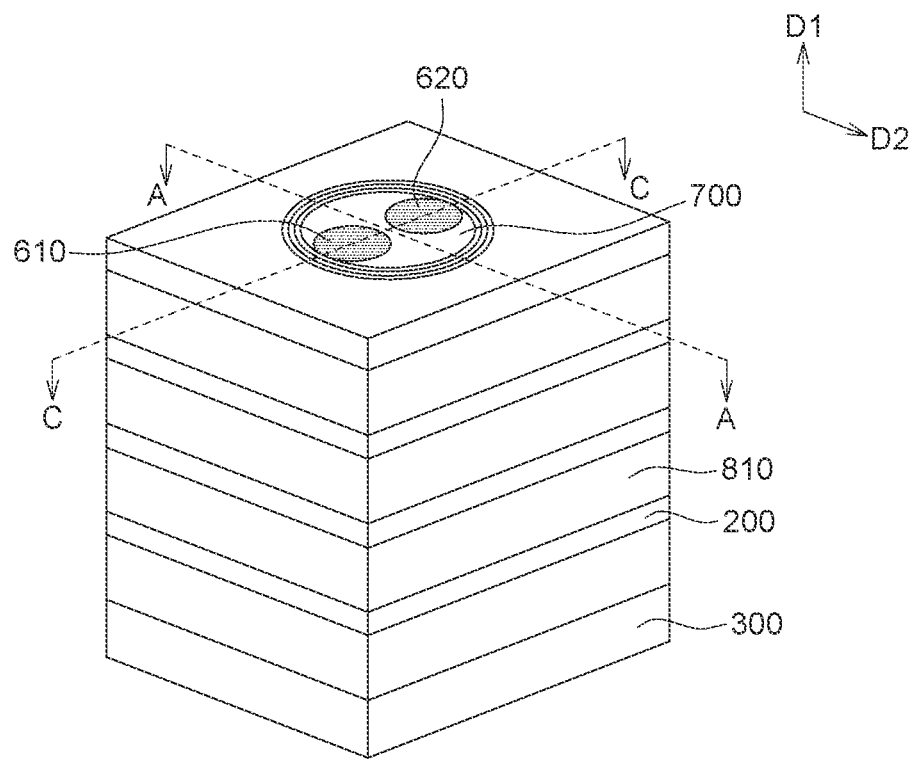
Figure 7C:
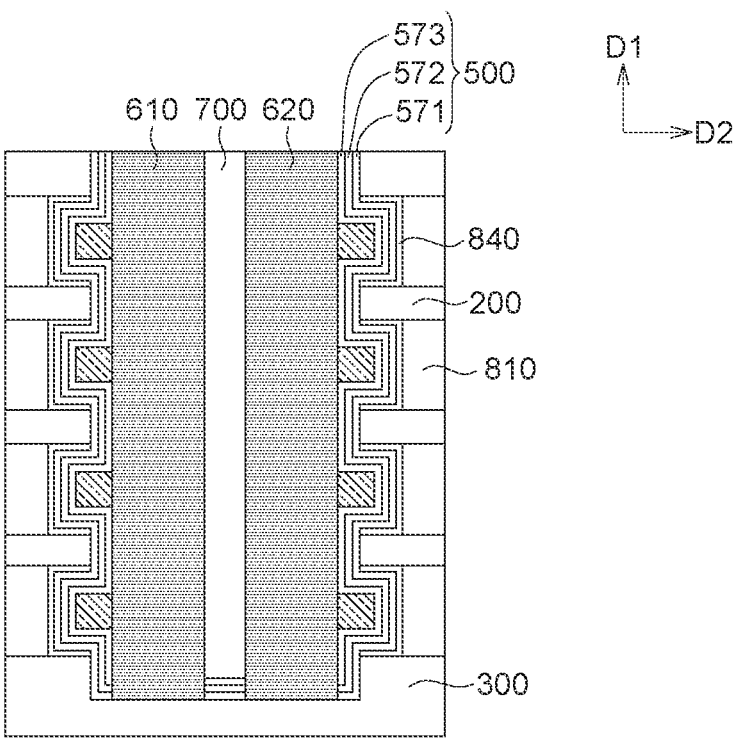

FIG. 7A to FIG. 7C are referred to. FIG. 7A and FIG. 7C are cross-section views respectively drawn along a A-A line and a C-C line in a stereoscopic view in FIG. 7B. The memory layer 500 may be formed on the substrate 300 and the sidewall insulating surfaces of the insulating layers 200 exposed by the opening 820, and on the second material layer 840 exposed by the recesses 830 by a deposition method. In an embodiment, the memory layer 500 may comprise an oxide-nitride-oxide (ONO) structure, for example comprising an oxide layer 571, a nitride layer 572 and an oxide layer 573. However, the present disclosure is not limited thereto. The memory layer 500 may comprise any kind of charge trapping structure, such as an ONONO structure, an ONONONO structure, or a BE-SONGS structure, etc. For example, a charge trapping layer may use a nitride such as silicon nitride, or other high-K materials comprising a metal oxide such as $Al_2O_3$, $HfO_2$, etc. The channel layers 400 may be formed on the memory layer 500 exposed by the recesses 830 by a deposition method. The channel layer 400 may comprise silicon, such as polysilicon or single crystal silicon, or other semiconductor materials. The insulating element 700 may be formed in the opening 820 by a deposition method. The insulating element 700 may comprise an oxide such as silicon oxide. However, the present disclosure is not limited thereto. The source element 610 and the drain element 620 may be formed in the insulating element 700 by a deposition method. The source element 610 and the drain element 620 may comprise silicon, such as polysilicon or single crystal silicon, or other semiconductor materials.

Figure 8A:
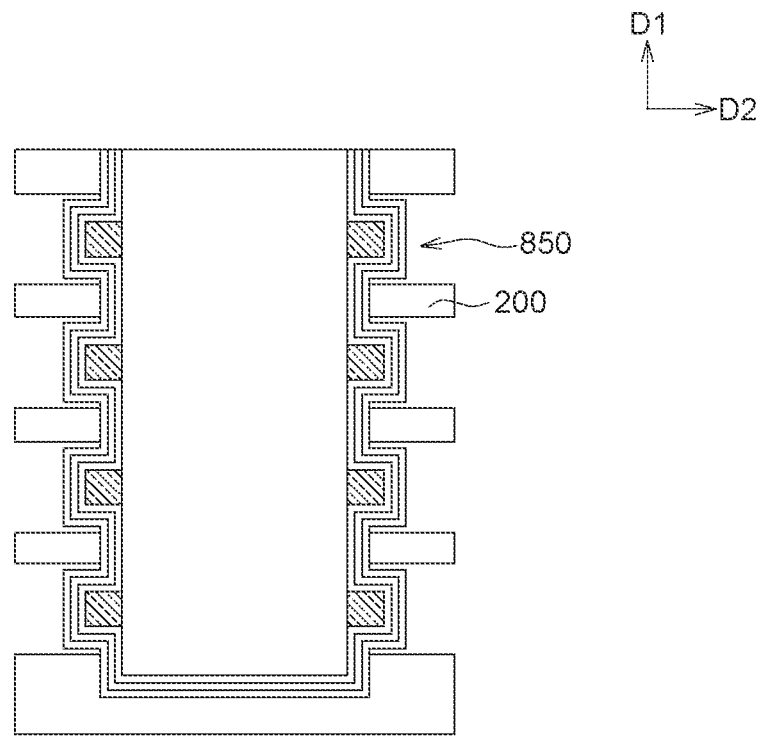
Figure 8B:
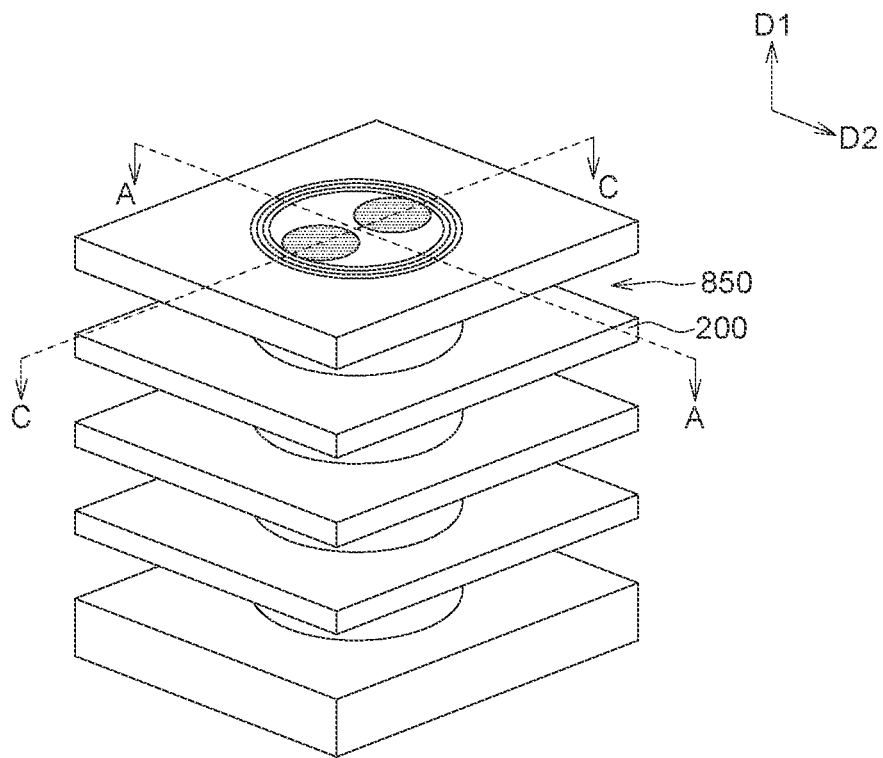
Figure 8C:
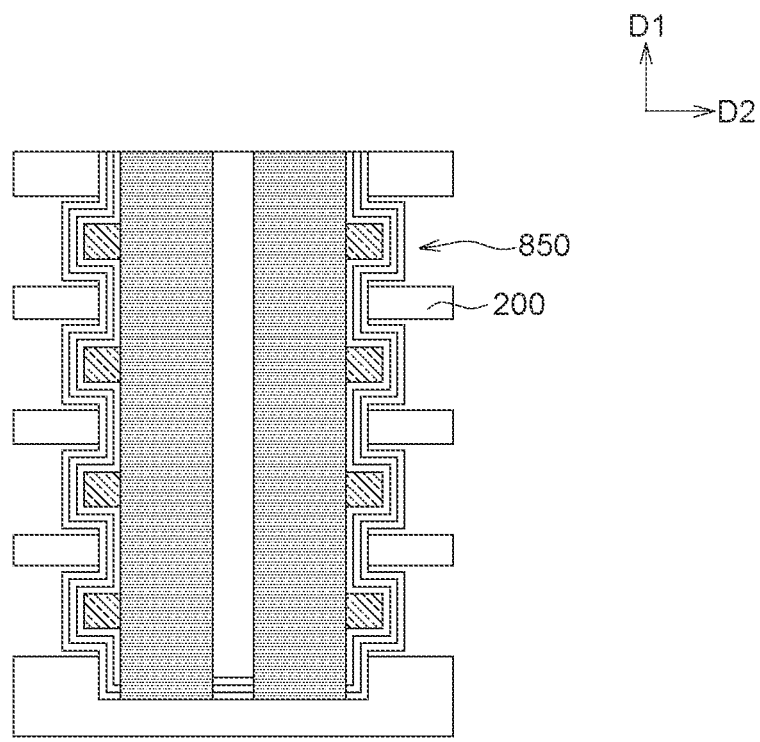

FIG. 8A to FIG. 8C are referred to. FIG. 8A and FIG. 8C are cross-section views respectively drawn along a A-A line and a C-C line in a stereoscopic view in FIG. 8B. The first material layers 810 and the second material layer 840 may be removed by an etching method to form slits 850 between the insulating layers 200.

Figure 9A:
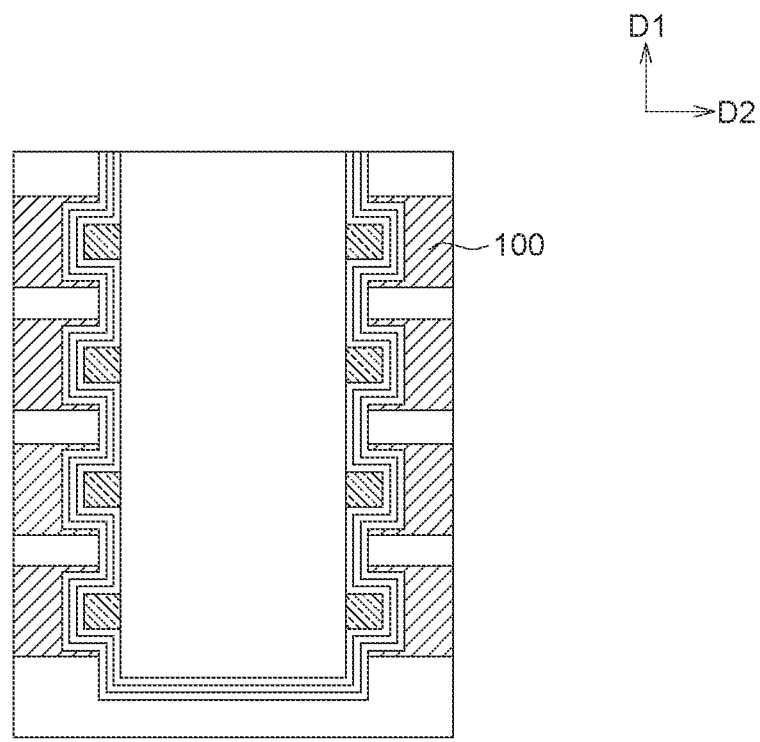
Figure 9B:
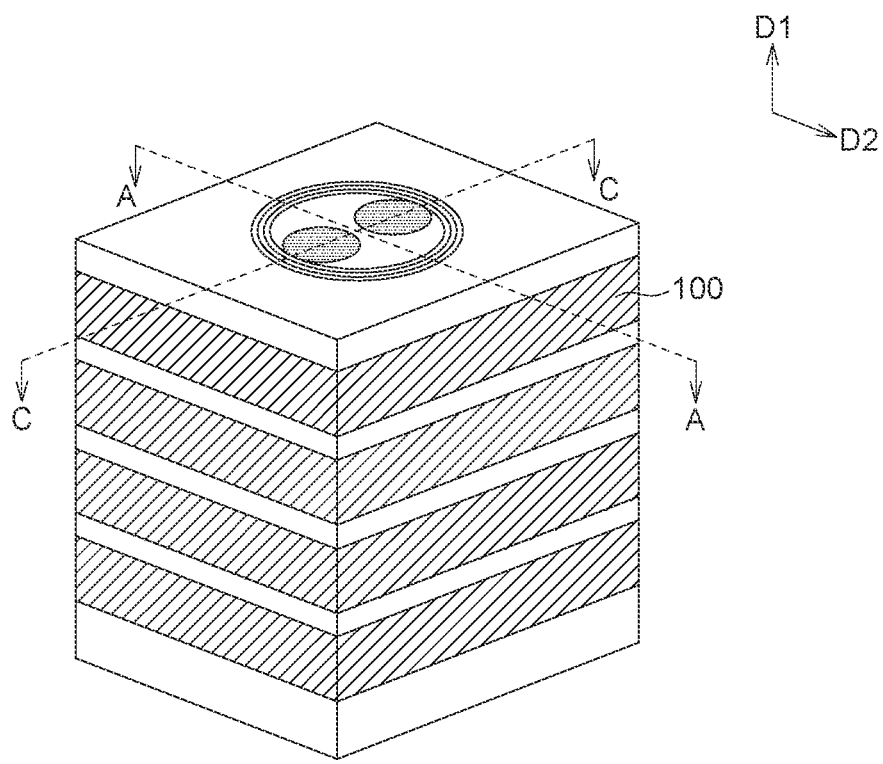
Figure 9C:
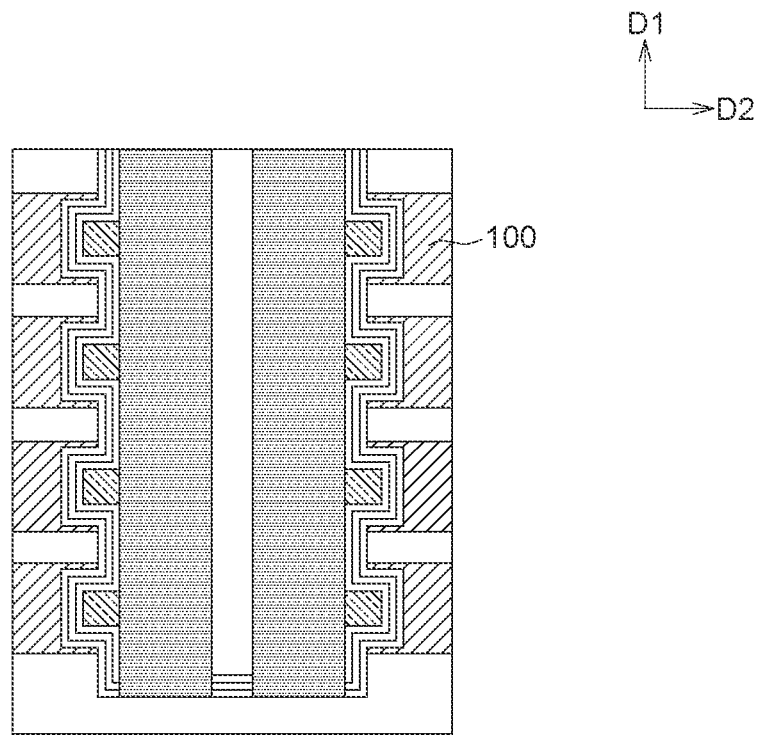

FIG. 9A to FIG. 9C are referred to. FIG. 9A and FIG. 9C are cross-section views respectively drawn along a A-A line and a C-C line in a stereoscopic view in FIG. 9B, The control electrode layers 100 may be formed by a deposition method to fill in the slits 850, The control electrode layer 100 may comprise a metal such as tungsten, or other conductive materials.

FIG. 10A to FIG. 13 illustrate a manufacturing method for a memory device in another embodiment. In an embodiment, a manufacture step illustrated with referring to FIG. 10A to FIG. 10B may be performed after the manufacture step illustrated with referring to FIG. 3A and FIG. 3B.

Figure 10A:
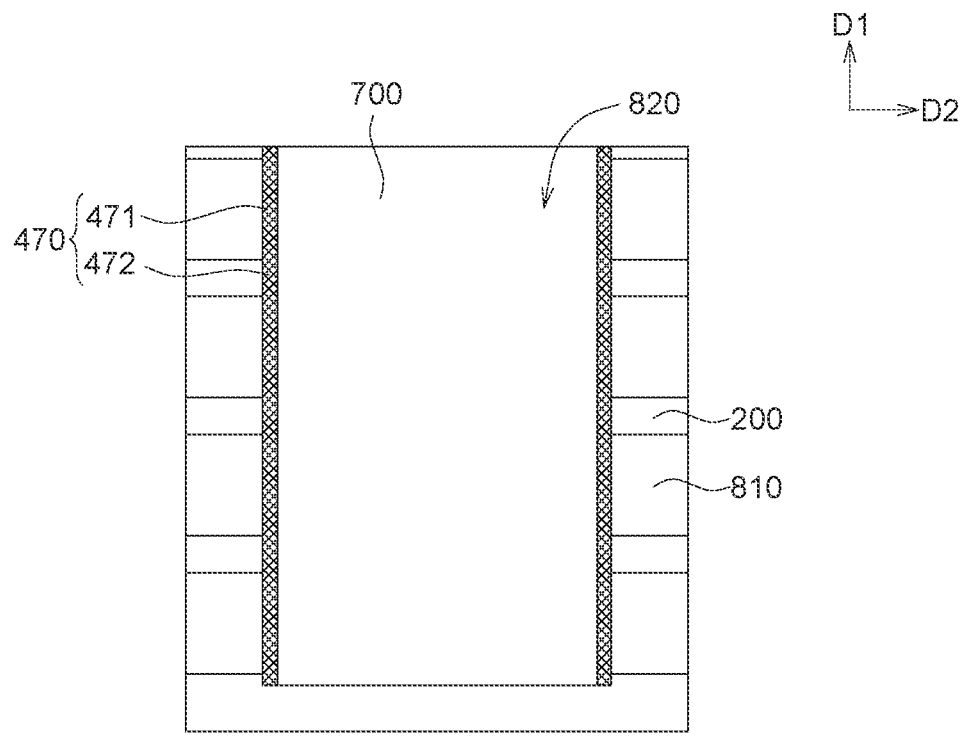
FIG. 10A to FIG. 13 illustrate a manufacturing method for a memory device in another embodiment.
Figure 10B:
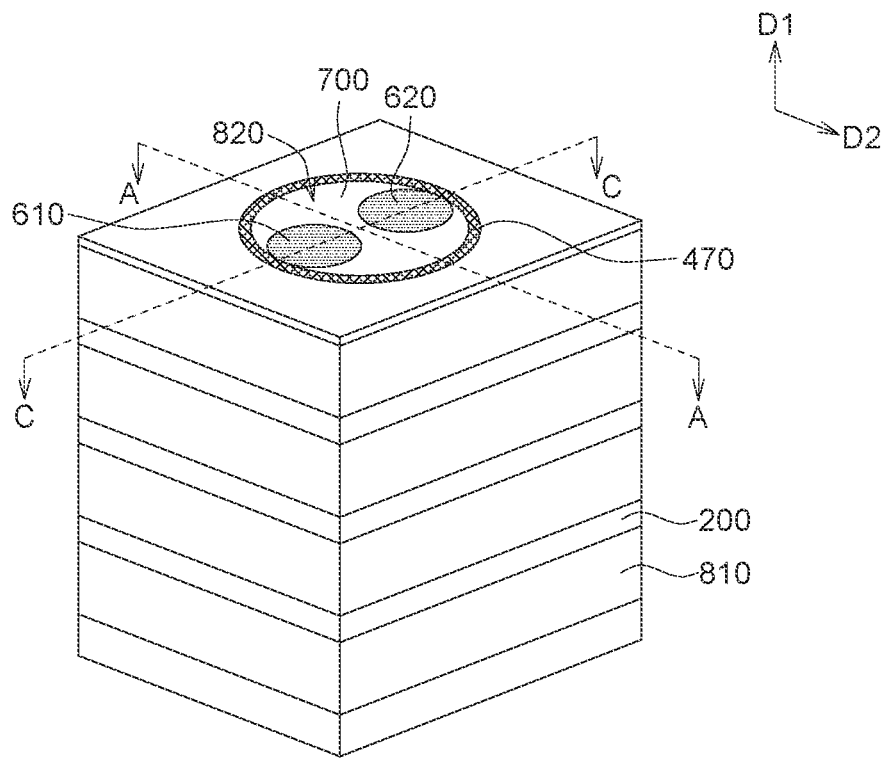
Figure 10C:
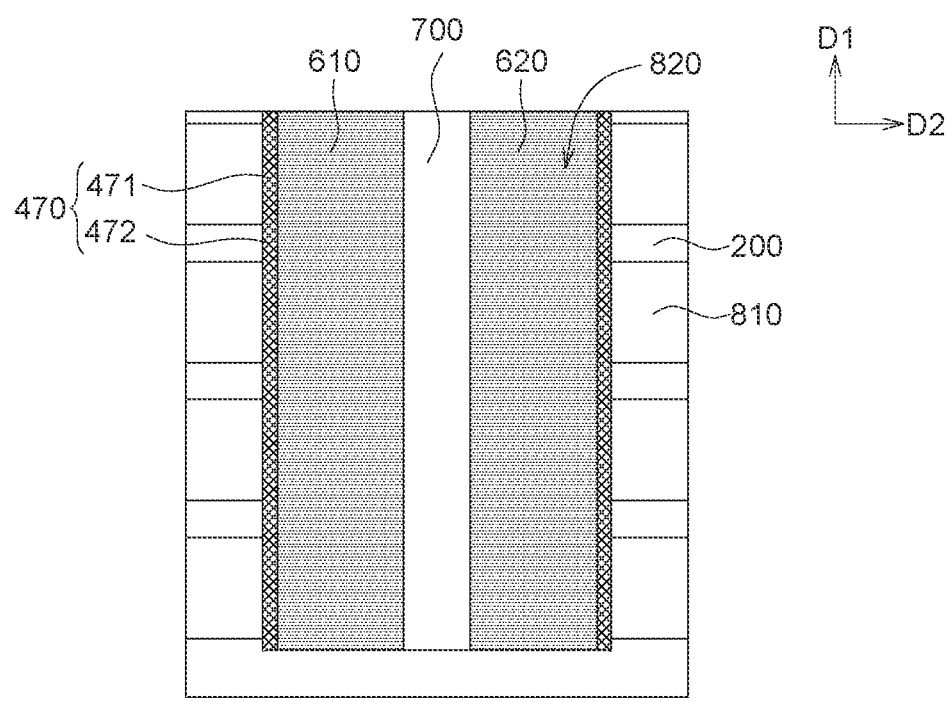

FIG. 10A to FIG. 10C are referred to. FIG. 10A and FIG. 10C are cross-section views respectively drawn along a A-A line and a C-C line in a stereoscopic view in FIG. 10B. The channel film 470 may be formed on sidewall surfaces of the first material layers 810 and the sidewall insulating surfaces of the insulating layers 200 exposed by the opening 820. The first channel film portions 471 of the channel film 470 may be on the first material layers 810. The second channel film portions 472 of the channel film 470 may be on the insulating layers 200, The channel film 470 may comprise silicon such as polysilicon or single crystal silicon, etc. The insulating element 700 may be formed in the opening 820. The source element 610 and the drain element 620 may be formed in the insulating element 700, and on a sidewall channel surface of the channel film 470.

Figure 11A:
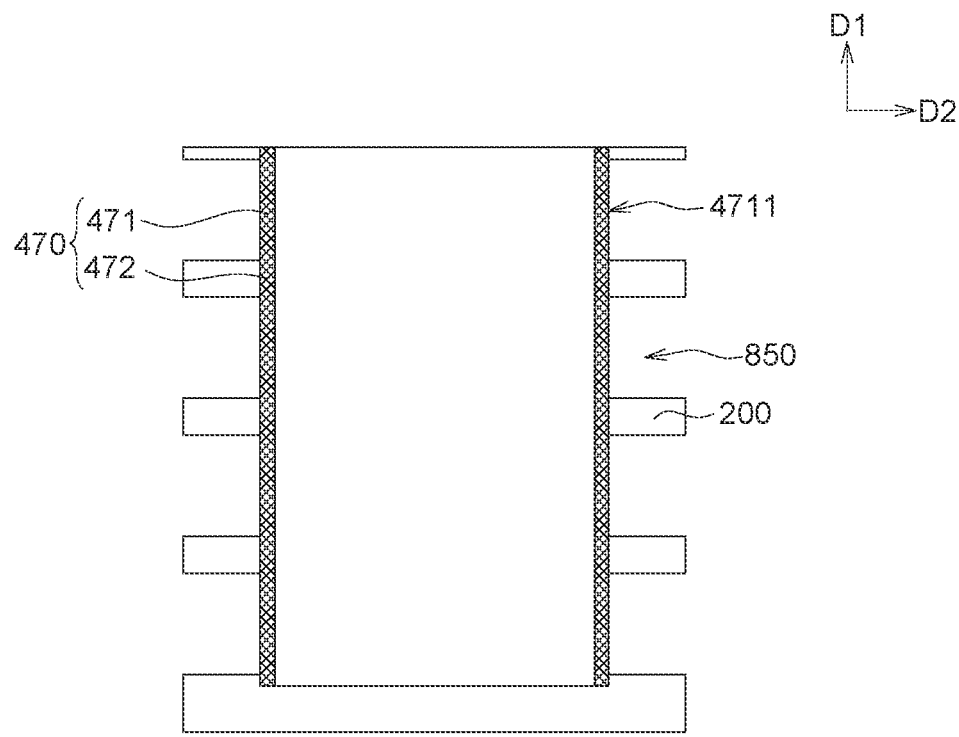
Figure 11B:
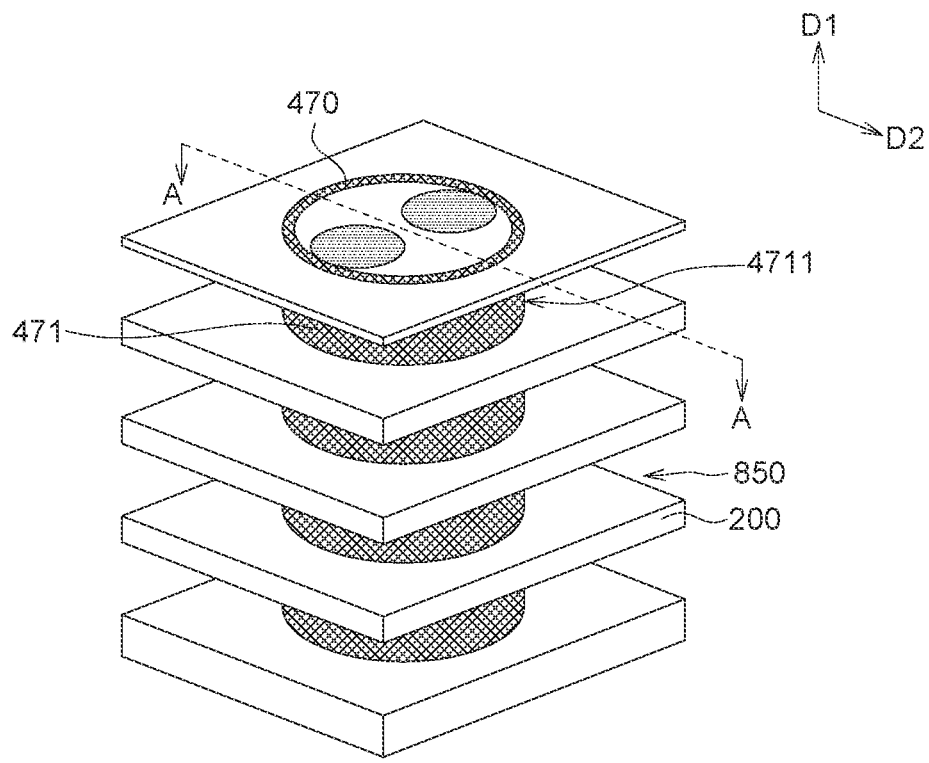

FIG. 11A and FIG. 11B are referred to. FIG. 11A is a ross-section view drawn along a A-A line in a stereoscopic view in FIG. 11B. The first material layers 810 may be removed to form the slits 850 between the insulating layers 200 and exposing the first channel surfaces 4711 of the first channel film portions 471.

Figure 12A:
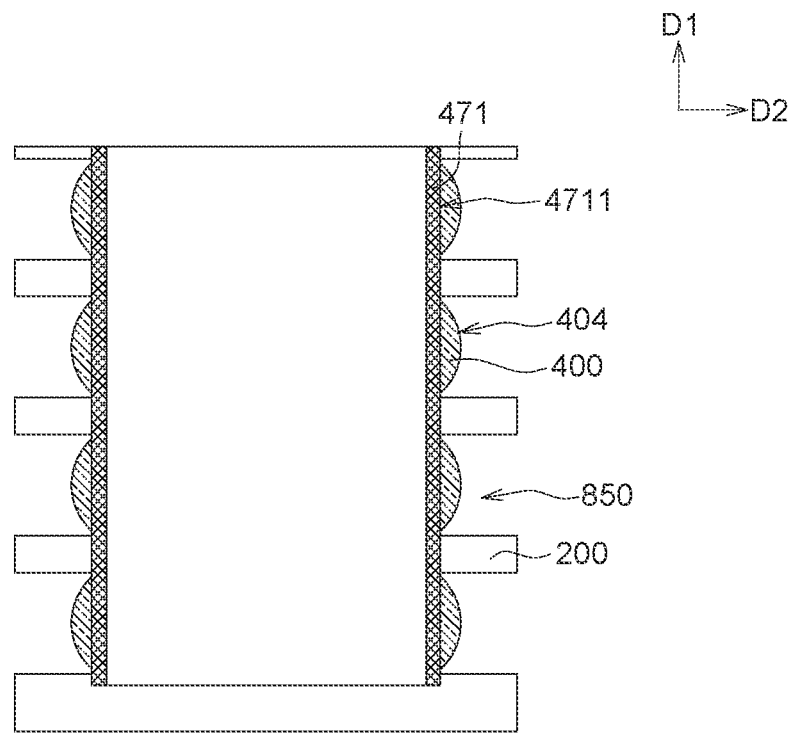
Figure 12B:
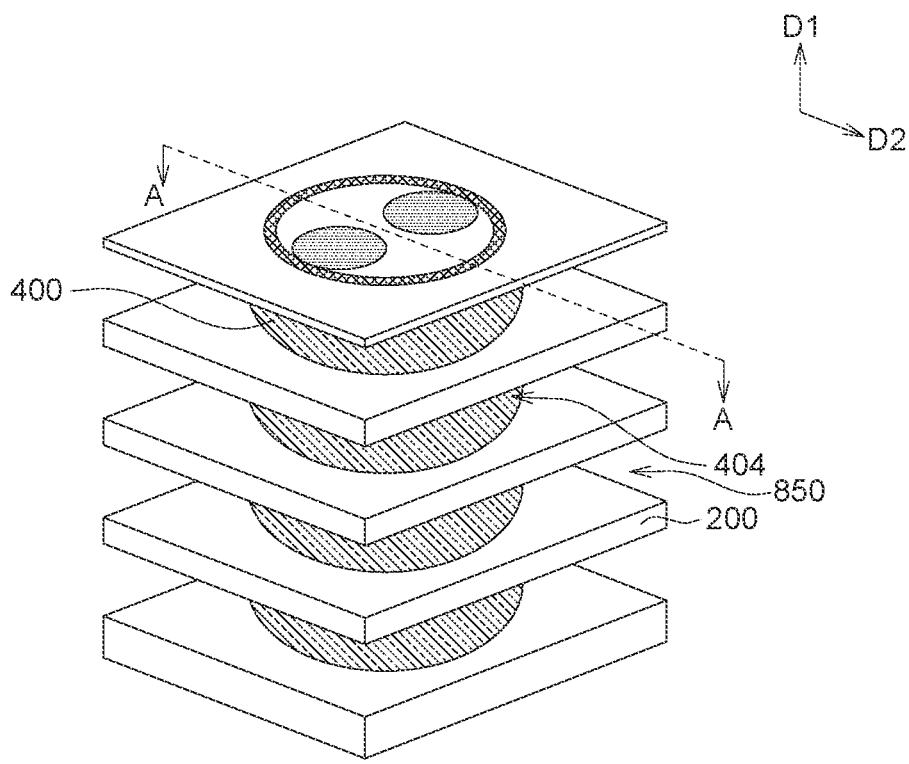

FIG. 12A and FIG. 12B are referred to. FIG. 12A is a rocs-section view drawn along a A-A line in a stereoscopic view in FIG. 123. The channel layers 400 may be formed on the first channel film portions 471. The channel layer 400 may comprise silicon such as polysilicon or single crystal silicon, etc. The channel layer 400 may be formed by a deposition method. In an embodiment, the channel layers 400 may be formed by growing from the first channel surfaces 4711 of the first channel film portions 471 exposed by the slits 850 by a selective epitaxial method. Therefore, the channel layer 400 is adjoined with the first channel surface 4711 of the first channel film portion 471. In an embodiment, the channel layer 400 formed by an epitaxial method may have a profile becoming thicker along directions towards a medium portion from opposing end portions thinner than the medium portion of the channel layer 400. In embodiments, the channel layer 400 is not limited to the profile as shown in the figures. The channel layer 400 may have any possible profile resulted from being formed on the first channel film portion 471 by a deposition method, or being formed by growing from the first channel surface 4711 of the first channel film portion 471 by an epitaxial method. For example, the channel surface 404 of the channel layer 400 may be a curve surface, a plane surface or an irregular surface.

Figure 13:
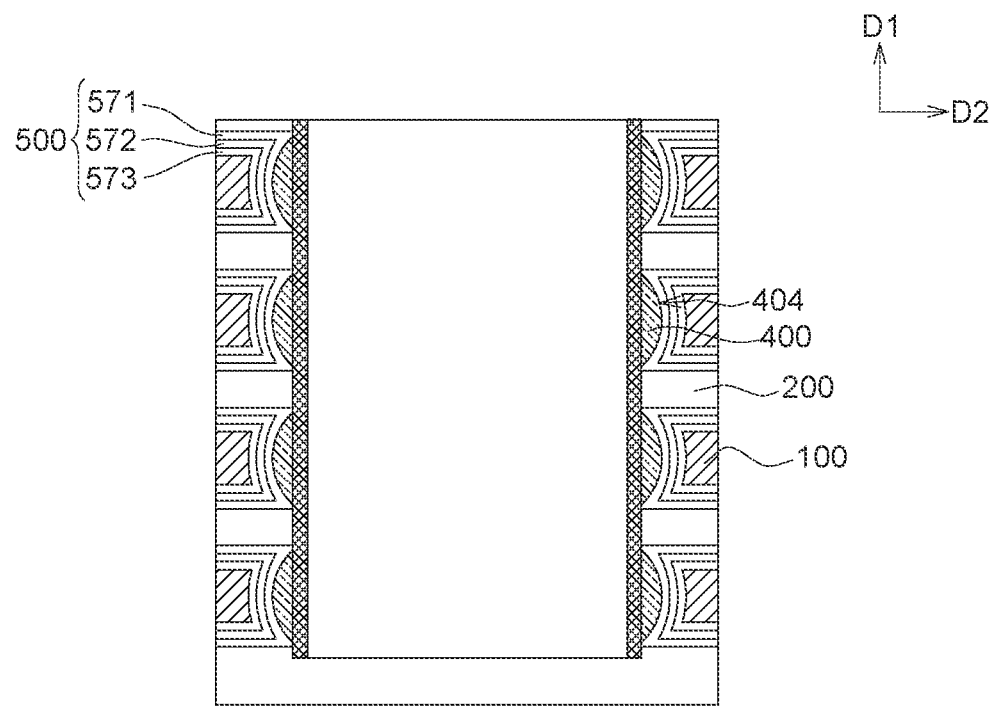

FIG. 13 is referred to. The memory layers 500 may be formed on the channel surfaces 404 of the channel layers 400 and the upper and lower insulating surfaces of the insulating layers 200 exposed by the slits 850. In an embodiment, the memory layer 500 may comprise an oxide-nitride-oxide (ONO) structure, for example comprising the oxide layer 571, the nitride layer 572 and the oxide layer 573. However, the present disclosure is not limited thereto. The control electrode layers 100 may be formed on the memory layers 500 exposed by the slits 850.

While the disclosure has been described by way of example and in terms of the exemplary embodiment(s), it is to be understood that the disclosure is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A memory device, comprising:
   a source element;
   a drain element;
   channel layers individually electrically connected between the source element and the drain element;
   control electrode layers; and
   a memory layer, wherein memory cells are defined in the memory layer between the control electrode layers and the channel layers;
   wherein the channel layers are separated from each other and stacked in a first direction, each of the channel layers surrounds the source element and the drain element which extend in the first direction.

2. The memory device according to claim 1, wherein the channel layers are separated from each other in a vertical direction by the memory layer.

3. The memory device according to claim 1, wherein each of the channel layers has a first interface with the memory layer, the first interfaces comprise bend surfaces.

4. The memory device according to claim 3, wherein each of the control electrode layers has a second interface with the memory layer, the second interfaces comprise bend surfaces.

5. The memory device according to claim 4, wherein the bend surfaces of the first interfaces have similar profiles with the bend surfaces of the second interfaces.

6. The memory device according to claim 4, wherein the memory cells are defined in the memory layer between the first interfaces and the second interfaces.

7. The memory device according to claim 1, wherein the channel layers are aligned parallel to distinct control electrode layers.

8. A memory device, comprising:
   a source element;
   a drain element;
   a channel element comprising thicker channel portions and thinner channel portions electrically connected to each other, and channel layers;
   control electrode layers; and
   a memory layer, wherein memory cells are defined in the memory layer between the thicker channel portions and the control electrode layers;
   wherein the channel layers are separated from each other and stacked in a first direction, each of the channel layers surrounds the source element and the drain element which extend in the first direction.

9. The memory device according to claim 8, wherein the thicker channel portions and the thinner channel portions are arranged alternately.

10. The memory device according to claim 8, wherein the channel element is electrically connected between the source element and the drain element.

11. The memory device according to claim 8, further comprising insulating layers, wherein the control electrode layers and the insulating layers are arranged alternately, the control electrode layers are on sidewall channel surfaces of the thicker channel portions, the insulating layers are on sidewall channel surfaces of the thinner channel portions.

12. The memory device according to claim 8, wherein the channel element comprises a channel film and channel layers, the channel film comprises first channel film portions and second channel film portions, each of the thicker channel portions comprises one of the channel layers and one of the first channel film portions, each of the thinner channel portions comprises one of the second channel film portions.

13. The memory device according to claim 8, wherein each of the thicker channel portions has a first interface with the memory layer, the first interfaces are curve surfaces.

14. The memory device according to claim 13, wherein each of the control electrode layers have a second interface with the memory layer, the second interface are curve surfaces.

15. The memory device according to claim 14, wherein curving directions of the first interfaces are similar with curving directions of the second interfaces.

16. The memory device according to claim 14, wherein the memory cells are defined in the memory layer between the first interfaces and the second interfaces.

17. A memory device, comprising:
   a source element;
   a drain element;
   control electrode layers;
   channel layers, wherein the channel layers and the control electrode layers are arranged alternately and overlap with each other in a first direction; and
   a memory layer, wherein memory cells are defined in the memory layer between the control electrode layers and the channel layers;
   wherein the channel layers are separated from each other and stacked in the first direction, each of the channel layers surrounds the source element and the drain element which extend in the first direction.

18. The memory device according to claim 17, wherein each of the control electrode layers comprises a branch electrode, the branch electrodes and the channel layers are arranged alternately in the first direction.

19. The memory device according to claim 17, wherein the channel layers are electrically connected between the source element and the drain element.

20. The memory device according to claim 17, wherein one control electrode layer of the control electrode layers comprises:
- a first branch electrode;
- a second branch electrode; and
- a trunk electrode electrically connected between the first branch electrode and the second branch electrode.

21. The memory device according to claim 17, wherein the channel layers have a size in the first direction smaller than a size of the control electrode layers in the first direction.

\* \* \* \* \*